(12) United States Patent
Hanson et al.

(10) Patent No.: US 9,162,612 B2
(45) Date of Patent: Oct. 20, 2015

(54) BRAKE TESTING DEVICE

(71) Applicants: Dean David Hanson, Hudson Bay, CA (US); Dean Larry Lasko, Mistatim, CA (US)

(72) Inventors: Dean David Hanson, Hudson Bay, CA (US); Dean Larry Lasko, Mistatim, CA (US)

(*) Notice: Subject to any disclaimer, the term of this patent is extended or adjusted under 35 U.S.C. 154(b) by 332 days.

(21) Appl. No.: 13/933,513

(22) Filed: Jul. 2, 2013

(65) Prior Publication Data

US 2014/0015657 A1    Jan. 16, 2014

Related U.S. Application Data

(60) Provisional application No. 61/671,391, filed on Jul. 13, 2012.

(51) Int. Cl.
*B60Q 1/26* (2006.01)
*B60T 17/22* (2006.01)
*G01R 31/00* (2006.01)

(52) U.S. Cl.
CPC ............. *B60Q 1/26* (2013.01); *B60T 17/221* (2013.01); *G01R 31/007* (2013.01)

(58) Field of Classification Search
CPC ......... G01L 5/28; B60T 17/28; G01R 31/006; B60W 10/18; B60W 10/182
USPC .......................................... 340/431; 324/503
See application file for complete search history.

(56) References Cited

U.S. PATENT DOCUMENTS

| | | | |
|---|---|---|---|
| 5,467,645 A | | 11/1995 | Skorupski |
| 5,602,482 A | | 2/1997 | Gutierrez |
| 5,668,314 A | | 9/1997 | Jones |
| 6,043,661 A | * | 3/2000 | Gutierrez .................. 324/504 |
| 6,154,035 A | * | 11/2000 | Aguirre et al. ............. 324/504 |
| 6,530,261 B1 | * | 3/2003 | Foster ........................... 73/39 |
| 6,817,234 B1 | | 11/2004 | Maresko |
| 2009/0056432 A1 | | 3/2009 | Steininger |

* cited by examiner

*Primary Examiner* — Kerri McNally
*Assistant Examiner* — Cal Eustaquio
(74) *Attorney, Agent, or Firm* — Ryan W. Dupis; Kyle R. Satterthwaite; Ade & Company, Inc.

(57) ABSTRACT

A brake testing device include a remote operated control module which is installed on a towing vehicle to remotely actuate the brake and turn signal lights for testing purposes. When installed on a truck with air brakes and a connection to air brakes on a connected trailer, auxiliary valves are installed on the truck brake pneumatic control line and the trailer brake pneumatic control line which are controlled remotely through the control module to test activation of the air brakes on the truck and trailer respectively.

17 Claims, 2 Drawing Sheets

BRAKE TESTING DEVICE

This application claims the benefit under 35 U.S.C.119(e) of U.S. provisional application Ser. No. 61/671,391, filed Jul. 13, 2012.

FIELD OF THE INVENTION

The present invention relates to a brake testing device including a control module connected to wiring circuits of a towing vehicle and a remote controller arranged to generate right turn, left turn and brake signals arranged to be received by the control module for actuating the respective right turn indicator, left turn indicator and brake indicator of a trailer connected to the towing vehicle.

BACKGROUND

When connecting a trailer to a towing vehicle it is commonly desirable to check that the turn and brake indicator signals to the trailer are functioning properly prior to use for safety concerns. Inspection typically requires two persons such that one person can activate the signals from the vehicle operator cab while the other person can visually inspect the indicator on the rear of the trailer. In commercial trucking in particular, routinely inspecting the operation of the indicators is generally part of a required safety inspection by the operator before each trip. Due to the difficulty in a single person both activating and inspecting the condition of the indicators, it occasionally leads to some operators not properly checking the condition of the trailer such that the safety of the operation of the trailer may be compromised.

US Patent Application Publication 2009/0056432 by Steininger discloses a remotely operated brake tester in the form of an actuator which physically depresses the brake pedal in the operator cab when activated by remote. While this permits checking of the brake indicators by a single operator, the actuator is cumbersome to install for each test as it must be removed for normal operation of the vehicle. Furthermore the operator must still make several trips between the operator cab and the rear of the trailer for checking other indicators such as the turn indicators in addition to the brake indicators.

U.S. Pat. No. 6,530,261 by Foster, U.S. Pat. No. 6,154,035 by Aguirre et al., U.S. Pat. No. 5,602,482 by Gutierrez and U.S. Pat. No. 5,668,314 by Jones disclose various brake test devices including their own respective power and compressed air supplies for direct connection to a trailer with air brakes to test various conditions of the trailer. Testing is limited to the trailer such that there is no testing provided for the connections between the vehicle and the trailer as required for a safety inspection prior to each trip with a towing vehicle and trailer connected thereto.

U.S. Pat. No. 6,817,234 by Maresko and U.S. Pat. No. 5,467,645 by Skorupski et al. disclose additional examples of brake testing systems, however neither permit remote checking of all indicators on a trailer connected to a towing vehicle prior to operation of the vehicle.

Overall no prior art device readily allows a single operator to check all turn and brake indicators on a vehicle and a connected trailer in a single pass about the vehicle during a pre-trip safety inspection.

SUMMARY OF THE INVENTION

According to one aspect of the invention there is provided a brake testing device in combination with a towing vehicle for connection to a trailer having a left turn indicator, a right turn indicator and air brakes, wherein the vehicle comprises:
a left turn indicator circuit for actuating a left turn indicator of the vehicle;
a right turn indicator circuit for actuating a right turn indicator of the vehicle;
a trailer connector including a left turn indicator output in connection with the left turn indicator circuit for actuating the left turn indicator of the trailer and a right turn indicator output in connection with the right turn indicator circuit for actuating the right turn indicator of the trailer;
an air braking system comprising a trailer brake connector arranged for connection to the air brakes of the trailer, a supply line for supplying air at a supply pressure, an exhaust line for exhausting compressed air, a trailer control line connected to the trailer brake connector, and a trailer brake controller arranged to selectively couple the trailer control line to either one of the supply line or the exhaust line to control operation of the air brakes of the trailer;
and wherein the brake testing device comprises:
a remote controller arranged to generate a left turn signal, a right turn signal and a brake signal;
a trailer auxiliary valve in communication between the trailer control line, the supply line and the exhaust line so as to be operable between a first position in which the trailer control line communicates with the supply line corresponding to releasing of the air brakes of the trailer and a second position in which the trailer control line communicates with the exhaust line corresponding to actuation of the air brakes of the trailer; and
a control module including:
  a receiver arranged to receive the left turn signal, the right turn signal and the brake signal from the remote controller;
  a left turn output connected to the left turn indicator circuit so as to be arranged to activate the left turn indicator of the trailer in response to receipt of the left turn signal by the receiver;
  a right turn output connected to the right turn indicator circuit so as to be arranged to activate the right turn indicator of the trailer in response to receipt of the right turn signal by the receiver; and
  a trailer brake output connected to the trailer auxiliary valve so as to be arranged to displace the trailer auxiliary valve from the first position to the second position in response to receipt of the brake signal by the receiver.

By providing a control module having outputs connected to vehicle systems in connection with a trailer, quick activation of all indicators by a single operator can be accomplished remotely to allow an operator to visually inspect the indicators during activation thereof. The addition of an auxiliary valve further allows testing of all air brake components between the vehicle activation point and the trailer reaction with a similar ease of use by a single operator.

The auxiliary valve preferably comprises a solenoid actuator which is arranged to locate the auxiliary valve in the second position to actuate the air brakes of the trailer when the solenoid actuator is de-energized.

Typically the air braking system of the vehicle further comprises air brakes of the vehicle, a vehicle control line connected to the air brakes of the vehicle, and a vehicle brake controller arranged to selectively couple the vehicle control line to either one of the supply line or the exhaust line to control operation of the air brakes of the vehicle. Accordingly the brake testing device may further comprise: i) a vehicle auxiliary valve in communication between the vehicle control line, the supply line and the exhaust line so as to be operable between a first position in which the vehicle control line communicates with the supply line corresponding to releasing of the air brakes of the vehicle and a second position in which the trailer control line communicates with the exhaust line corresponding to actuation of the air brakes of the vehicle; and ii) a vehicle brake output on the control module which is connected to the vehicle auxiliary valve so as to be arranged to displace the vehicle auxiliary valve from the first position to the second position in response to receipt of the brake signal by the receiver.

Preferably an override sensor is in communication with the control module which is arranged to detect normal driving mode of the towing vehicle and trailer combination. In this instance the control module is preferably arranged to interrupt the trailer brake output and the truck brake output of the control module when the normal driving mode is detected by the override sensor.

When the towing vehicle further comprises a trailer brake release arranged to supply pressure to the air brakes of the trailer to release the brakes when activated and a vehicle brake release arranged to supply pressure to brakes of the towing vehicle to release the brakes when activated, preferably the override sensor of the brake testing device is arranged to detect when both the trailer brake release and the vehicle brake release are activated. The override sensor may comprise a pair of air switches in communication with the trailer brake release and the vehicle brake release respectively.

In further embodiments the brake testing device may further comprise a logging device in communication with the control module so as to be arranged to log each signal received by the receiver of the control module.

The left turn output and the right turn output may each comprise a splice connector in spliced connection with the respective indicator circuit. Alternatively, the left turn output and right turn output may comprise plug-in connectors in modular connection with a wiring harness of the indicator circuits.

According to a second aspect of the present invention there is provided a brake testing device in combination with a towing vehicle for connection to a trailer having a left turn indicator, a right turn indicator and brake lights, wherein the vehicle comprises:
  a left turn indicator circuit for actuating a left turn indicator of the vehicle;
  a right turn indicator circuit for actuating a right turn indicator of the vehicle;
  a braking indicator circuit for actuating a brake light of the vehicle;
  a trailer connector including a left turn indicator output in connection with the left turn indicator circuit for actuating the left turn indicator of the trailer, a right turn indicator output in connection with the right turn indicator circuit for actuating the right turn indicator of the trailer, and a braking output in connection with the braking indicator circuit for actuating the brake lights of the trailer;
  and wherein the brake testing device comprises:
  a remote controller arranged to generate a left turn signal, a right turn signal and a brake signal;
  a control module including:
    a receiver arranged to receive the left turn signal, the right turn signal and the brake signal from the remote controller;
    a left turn output connected to the left turn indicator circuit so as to be arranged to activate the left turn indicator of the trailer in response to receipt of the left turn signal by the receiver;
    a right turn output connected to the right turn indicator circuit so as to be arranged to activate the right turn indicator of the trailer in response to receipt of the right turn signal by the receiver; and
    a brake output connected to the braking indicator circuit so as to be arranged to activate the brake lights of the trailer in response to receipt of the brake signal by the receiver.

In each instance, the control module preferably includes a power input arranged to connect to a battery of the vehicle.

In either embodiment, the left turn output and the right turn output may each comprise a splice connector in spliced connection with the respective indicator circuit, or alternatively the left turn output and right turn output may comprise plug-in connectors in modular connection with a wiring harness of the indicator circuits.

Various embodiments of the invention will now be described in conjunction with the accompanying drawings in which:

BRIEF DESCRIPTION OF THE DRAWINGS

In the drawings like characters of reference indicate corresponding parts in the different figures.

DETAILED DESCRIPTION

Figure 1:
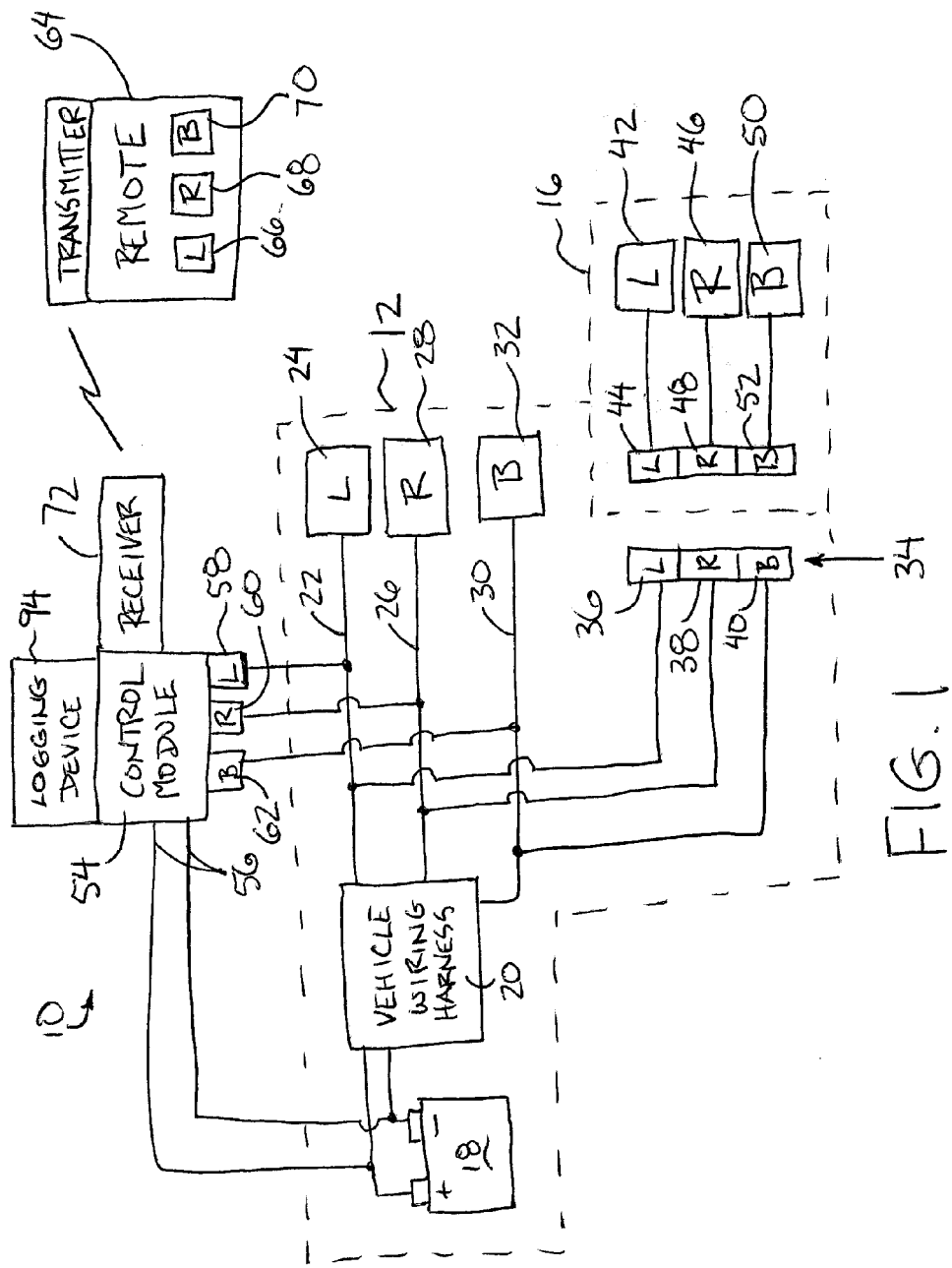
FIG. 1 is a schematic representation of a first embodiment of the brake testing device in connection with a vehicle having a trailer connector for connection to a trailer.

Referring to the accompanying figures there is illustrated a brake testing device generally indicated by reference numeral 10. The device 10 is particularly suited for use with a towing vehicle 12 which includes a trailer connector 34 to be connected to a trailer 16 towed by the vehicle. Although more than one embodiment is shown in the accompanying figures, the common features of the various embodiments will first be described.

The towing vehicle 12 generally includes a battery 18 for supplying electrical power to various electrical components of the vehicle. The electrical components include a wiring harness 20 which includes a left turn indicator circuit 22 which controls activation of a left turn indicator 24 of the vehicle and a right turn indicator circuit 26 for controlling a right turn indicator 28 of the vehicle.

A brake circuit 30 also controls activation of the brake lights 32 of the vehicle. The vehicle includes a trailer connector 34 which provides output of various indicator signals to various indicators of the trailer connected thereto. More particularly the trailer connector 34 includes a left turn output 36 connected to the left turn indicator circuit 22, a right turn output 38 connected to the right turn indicator circuit and a brake output 40 connected to the braking circuit of the braking vehicle.

The trailer typically includes a left turn indicator 42 in connection to a mating input 44 which mates with the left turn output 36 of the trailer connector. A right turn indicator 46 of the trailer is connected to a mating input 48 which similarly mates with the corresponding right turn output 38 of the trailer connector of the vehicle. Brake lights 50 of the trailer are connected to a mating input 52 which mate with the corresponding brake output 40 of the trailer connector 34.

The brake testing device 10 includes a control module 54 having a power input 56 connected to the vehicle battery. The module further includes a left turn output 58 connected to the left turn indicator circuit 22, a right turn output 60 connected to the right turn indicator circuit 26 and a brake output 62 for outputting a brake signal therefrom.

In some embodiments, the outputs of the control module are connected to corresponding circuits of the vehicle using a splice connector which provides a spliced connection with a respective circuit.

In alternative embodiments, the outputs may comprise plug-in connectors arranged for modular connection with corresponding modular components of the wiring harness and indicator circuits of the vehicle.

The brake testing device 10 further includes a remote controller 64 (or keyfob) having a respective housing locating a battery and a radio frequency (RF) transmitter therein. The controller further includes a left turn button 66 which generates a left turn signal to be transmitted by the transmitter when actuated, a right turn button 68 arranged to generate a right turn signal transmitted by the transmitter when actuated and a brake button 70 arranged to generate a brake signal to be transmitted by the RF transmitter when actuated.

The control module 54 further includes a RF receiver 72 arranged to receive the signals generated and transmitted by the remote controller. The left turn signal, the right turn signal and the brake signal are transmitted by the control module to the respective left turn output 58, right turn output 60 and brake output 62. The outputs of the control module are connected to the circuits of the vehicle such that both the corresponding indicators on the vehicle and the corresponding indicators of the trailer can be actuated in response to receipt of the respective signal from the remote controller.

Turning now more particularly to the embodiment of FIG. 1, in this instance, the brake lights 32 of the vehicle are actuated by an electrical braking circuit 30 which is in turn activated directly by depressing the brake pedal of the vehicle. The electrical brake signal is transmitted from brake circuit 30 directly to the brake output 40 of the trailer connector to activate the brake lights 50 of the trailer through the mating input 52 on the trailer. During a testing exercise, the control module provides the brake signal to the brake lights 50 of the trailer by the brake output 62 of the control module being in direct connection to the braking circuit 30 of the vehicle. The brake signal transmitted from the control module to the vehicle is thus also communicated through the trailer connector to permit the trailer brakes to be activated in response to the brake button 70 on the remote controller generating a brake signal.

Figure 2:
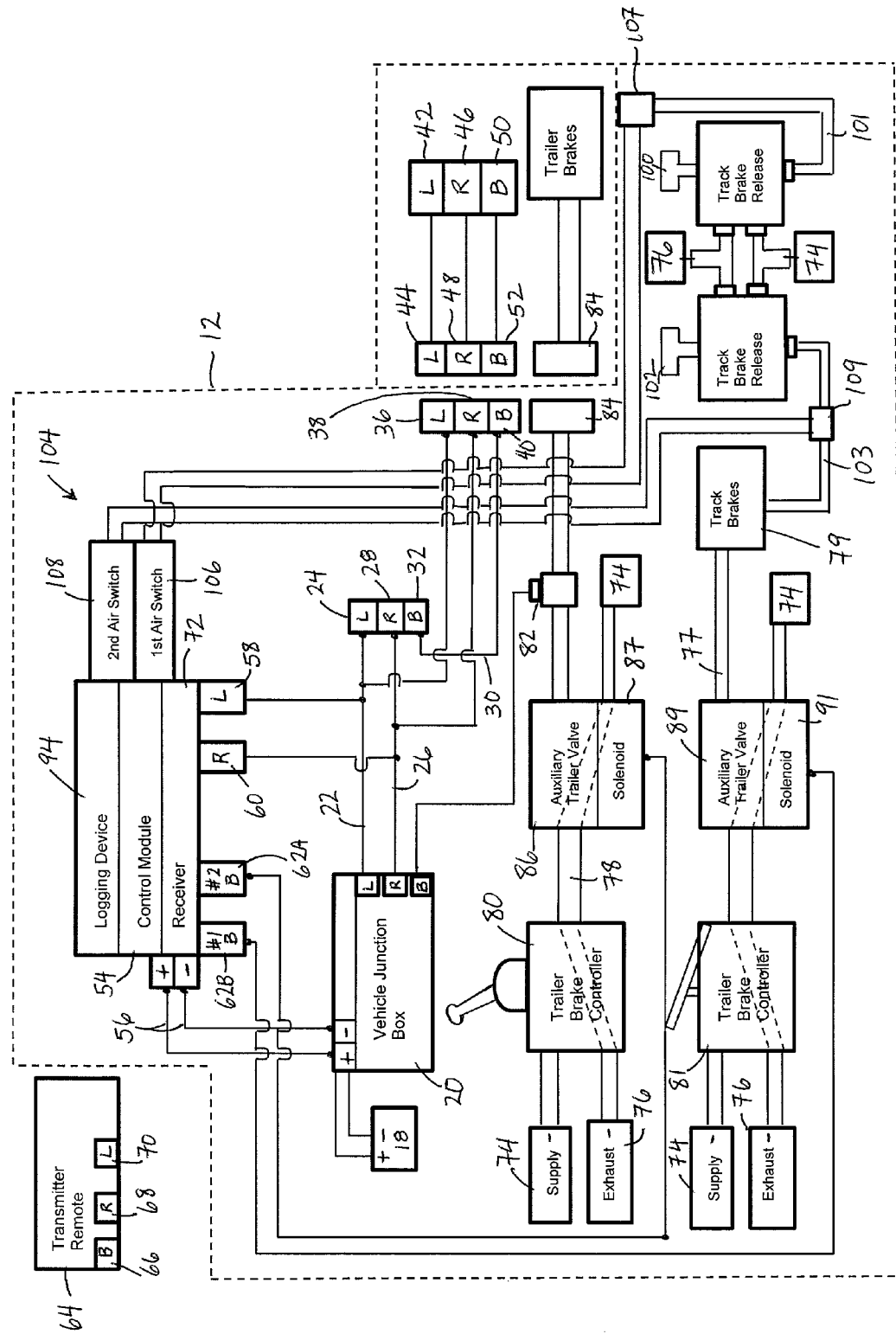
FIG. 2 is a schematic representation of the brake testing device according to a second embodiment in which the vehicle includes air brakes for connection to the air brakes of a connected trailer.

Alternatively in the second embodiment shown in FIG. 2, the control module can be adapted for use with a vehicle and trailer including air brakes. Typically, the vehicle in this instance includes a supply tank of compressed air to supply air under pressure therefrom and an exhaust line 76 permitting compressed air to be exhausted to atmosphere therethrough.

The vehicle typically includes a primary delivery line 77 and a secondary delivery line 78. The primary delivery line 77 is arranged for supplying compressed air at a controller pressure to primary brakes 79 of the vehicle using a primary brake controller 81 which selectively couples the primary delivery line to either the supply tanks 74 to deactivate the primary brakes or the exhaust 76 to apply the primary brakes respectively.

The secondary delivery line 78 supplies air at a controlled pressure therethrough for delivery to brakes of the trailer to control the activation thereof. A secondary brake controller 80 selectively communicates the secondary delivery line with the exhaust 76 for applying the brakes and with the supply tank 74 for deactivating the brakes.

The brake circuit for the trailer in this instance generally includes a pressure sensor 82 coupled to the secondary delivery line 78 so as to be arranged to generate a brake signal when the pressure sensor senses a drop in pressure in the delivery corresponding to the delivery line being communicated with the exhaust 76 which indicates activation of the brakes. The pressure sensor 82 is connected to the brake output 40 of the trailer connector 34 and the brake lights 32 of the vehicle to transmit the brake signal to the brake lights 50 of the trailer through the corresponding mating input 52 and to the brake lights 32 of the vehicle.

The secondary delivery line is also provided with mating connectors 84 to permit pressurized air supply lines from the vehicle to be connected with the corresponding lines of the trailer to control activation of the trailer brakes with the secondary controller 80.

The testing device 10 further includes a trailer auxiliary valve 86 in the form of a three-way valve actuated by a solenoid 87. The valve 86 includes a delivery connector in the form of a tee in connection with the secondary delivery line 78, a supply connector in the form of a tee connected to the supply line from the supply tank 74 and an exhaust connector which exhausts through the controller 80 to the exhaust 76.

The trailer auxiliary valve 86 is operable from a first position in which the controlled delivery line 78 communicates with the supply line of the supply tank 74 corresponding to releasing of the air brakes of the trailer and a second position in which the controlled delivery line 78 communicates with the exhaust line of the exhaust 76 corresponding to actuation of the air brakes of the trailer. Typically the solenoid actuator 87 is arranged to locate the valve 86 in the second position to activate the air brakes of the trailer when the solenoid actuator is de-energized while releasing the brakes when energized.

In this instance, the control module includes a trailer brake output 62A which is coupled to the solenoid actuator 87 of the auxiliary valve 86 to activate the trailer auxiliary valve from the first position to the second position when the brake signal is received from the remote controller and transmitted by the control module through the trailer brake output 62A to the trailer auxiliary valve 86. The trailer brakes and brake indicators can thus be activated in the usual manner using the trailer brake controller under normal operation of the vehicle to produce a pressure drop in the delivery line 78 so that the pressure sensor 82 generates the brake signal for actuating the brake lights. Alternatively the brake signal can be generated by the remote controller and transmitted to the auxiliary valve to produce the pressure drop in the delivery line 78 so that the pressure sensor 82 again generates a brake signal in the braking circuit for actuating the brake indicators on the trailer.

The testing device 10 further includes a vehicle auxiliary valve 89 in the form of a three-way valve actuated by a solenoid 91. The valve 89 includes a delivery connector in the form of a tee in connection with the secondary delivery line 78, a supply connector in the form of a tee connected to the supply line from the supply tank 74 and an exhaust connector which exhausts through the truck brake controller 81 to the exhaust 76.

The vehicle auxiliary valve 89 is operable from a first position in which the controlled primary delivery line 77 communicates with the supply line of the supply tank 74 corresponding to releasing of the air brakes of the vehicle and a second position in which the controlled delivery line 77 communicates with the exhaust line of the exhaust 76 corresponding to actuation of the air brakes of the vehicle. Typically the solenoid actuator 91 is arranged to locate the valve 89 in the second position to activate the air brakes of the vehicle when the solenoid actuator is de-energized while releasing the brakes when energized.

In this instance, the control module also includes a vehicle brake output 62B which is coupled to the solenoid actuator 91 of the vehicle auxiliary valve 89 to activate the vehicle auxiliary valve from the first position to the second position when the brake signal is received from the remote controller and transmitted by the control module through the vehicle brake output 62B to the vehicle auxiliary valve 89. The vehicle brakes and brake indicators can thus be activated in the usual manner using the vehicle brake controller under normal operation of the vehicle. Alternatively the brake signal can be generated by the remote controller and transmitted to the vehicle auxiliary valve for actuating the brakes of the vehicle.

Typically, the towing vehicle further comprises a trailer brake release 100 which is coupled to the supply 74 and exhaust 76 and has a controlled output 101 connected to the trailer brakes through a suitable trailer connection. The trailer brake release 100 is located in the operator cab of the towing vehicle and is arranged to supply pressure to the air brakes of the trailer through the controlled output 101 to release the brakes when activated. Alternatively, when deactivated, the air brakes of the trailer are exhausted to apply the trailer brake through the controlled output 101.

Similarly, the towing vehicle typically further comprises a vehicle brake release 102 which is coupled to the supply 74 and exhaust 76 and has a controlled output 103 connected to the vehicle brakes. The controller output of the vehicle brake release 102 is arranged to supply pressure to brakes of the vehicle to release the brakes when the vehicle brake release 102 is activated. Alternatively, when deactivated, the air brakes of the vehicle are exhausted to apply the truck brakes by the controlled output 103.

An override sensor 104 is in communication with the control module which is arranged to detect normal driving mode of the towing vehicle and trailer combination. The control module is then arranged to interrupt the trailer brake output and the truck brake output of the control module when the normal driving mode is detected by the override sensor.

The override sensor 104 in the illustrated embodiment takes the form of a first air switch 106 in communication with the controlled output 101 of the trailer brake release using a tee connection 107 and a second air switch 108 in communication with the controlled output 103 of the vehicle brake release using a tee connection 109.

When the first and second air switches of the override sensor of the brake testing device detect when both the trailer brake release and the vehicle brake release are activated, the control module interrupts both brake outputs 62A and 62B.

Alternatively, when only the first air switch 106 detects that the trailer brake release is activated, but the second air switch 108 detects that the truck brake release is deactivated, receipt of the brake signal by the control module only results in the trailer brakes being activated through the trailer brake output 62A.

Similarly, when only the second air switch 108 detects that the truck brake release is activated, but the first air switch 106 detects that the trailer brake release is deactivated, receipt of the brake signal by the control module only results in the vehicle brakes being activated through the vehicle brake output 62B.

In either of the embodiments of FIG. 1 or 2, the control module can further include a logging device 94 in communication therewith which records each turn signal or brake signal received from the remote controller and transmitted to the corresponding circuits of the vehicle and trailer. Typically, the logging device will record the type of signal communicated as well as the time and date of communication to be recorded in a memory for subsequent recall as may be desired. The logging device 94 is particularly suited for use by commercial vehicle management to provide confirmation that an operator of the vehicle followed proper safety features before each trip.

Since various modifications can be made in my invention as herein above described, and many apparently widely different embodiments of same made within the spirit and scope of the claims without department from such spirit and scope, it is intended that all matter contained in the accompanying specification shall be interpreted as illustrative only and not in a limiting sense.

The invention claimed is:

1. A brake testing device in combination with a towing vehicle for connection to a trailer having a left turn indicator, a right turn indicator and air brakes, wherein the vehicle comprises:
   a left turn indicator circuit for actuating a left turn indicator of the vehicle;
   a right turn indicator circuit for actuating a right turn indicator of the vehicle;
   a trailer connector including a left turn indicator output in connection with the left turn indicator circuit for actuating the left turn indicator of the trailer and a right turn indicator output in connection with the right turn indicator circuit for actuating the right turn indicator of the trailer;
   an air braking system comprising a trailer brake connector arranged for connection to the air brakes of the trailer, a supply line for supplying air at a supply pressure, an exhaust line for exhausting compressed air, a trailer control line connected to the trailer brake connector, and a trailer brake controller arranged to selectively couple the trailer control line to either one of the supply line or the exhaust line to control operation of the air brakes of the trailer;
   and wherein the brake testing device comprises:
   a remote controller arranged to generate a left turn signal, a right turn signal and a brake signal;
   a trailer auxiliary valve in communication between the trailer control line, the supply line and the exhaust line so as to be operable between a first position in which the trailer control line communicates with the supply line corresponding to releasing of the air brakes of the trailer and a second position in which the trailer control line communicates with the exhaust line corresponding to actuation of the air brakes of the trailer; and
   a control module including:
      a receiver arranged to receive the left turn signal, the right turn signal and the brake signal from the remote controller;
      a left turn output connected to the left turn indicator circuit so as to be arranged to activate the left turn indicator of the trailer in response to receipt of the left turn signal by the receiver;
      a right turn output connected to the right turn indicator circuit so as to be arranged to activate the right turn indicator of the trailer in response to receipt of the right turn signal by the receiver; and a trailer brake output connected to the trailer auxiliary valve so as to be arranged to displace the trailer auxiliary valve from the first position to the second position in response to receipt of the brake signal by the receiver.

2. The brake testing device according to claim 1 wherein the control module includes a power input arranged to connect to a battery of the vehicle.

3. The brake testing device according to claim 1 wherein the auxiliary valve comprises a solenoid actuator which is arranged to locate the auxiliary valve in the second position to actuate the air brakes of the trailer when the solenoid actuator is de-energized.

4. The brake testing device according to claim 1 wherein the left turn output and the right turn output each comprise a splice connector in spliced connection with the respective indicator circuit.

5. The brake testing device according to claim 1 wherein the left turn output and right turn output comprise plug-in connectors in modular connection with a wiring harness of the indicator circuits.

6. The brake testing device according to claim 1 further comprising a logging device in communication with the control module so as to be arranged to log each signal received by the receiver of the control module.

7. The brake testing device according to claim 1 further comprising an override sensor in communication with the control module, the override sensor being arranged to detect normal driving mode of the towing vehicle and trailer combination, and the control module being arranged to interrupt the trailer brake output when the normal driving mode is detected by the override sensor.

8. The brake testing device according to claim 7 wherein the towing vehicle further comprises a trailer brake release arranged to supply pressure to the air brakes of the trailer to release the brakes of the trailer when activated and a vehicle brake release arranged to supply pressure to brakes of the towing vehicle to release the brakes of the towing vehicle when activated, and wherein the override sensor of the brake testing device is arranged to detect when both the trailer brake release and the vehicle brake release are activated.

9. The brake testing device according to claim 8 wherein the override sensor comprises a pair of air switches in communication with the trailer brake release and the vehicle brake release respectively.

10. The brake testing device according to claim 1 wherein:
the air braking system of the vehicle further comprises air brakes of the vehicle, a vehicle control line connected to the air brakes of the vehicle, and a vehicle brake controller arranged to selectively couple the vehicle control line to either one of the supply line or the exhaust line to control operation of the air brakes of the vehicle; and
the brake testing device further comprises:
a vehicle auxiliary valve in communication between the vehicle control line, the supply line and the exhaust line so as to be operable between a first position in which the vehicle control line communicates with the supply line corresponding to releasing of the air brakes of the vehicle and a second position in which the trailer control line communicates with the exhaust line corresponding to actuation of the air brakes of the vehicle; and
a vehicle brake output on the control module which is connected to the vehicle auxiliary valve so as to be arranged to displace the vehicle auxiliary valve from the first position to the second position in response to receipt of the brake signal by the receiver.

11. The brake testing device according to claim 10 further comprising an override sensor in communication with the control module, the override sensor being arranged to detect normal driving mode of the towing vehicle and trailer combination, and the control module being arranged to interrupt the trailer brake output and the vehicle brake output when the normal driving mode is detected by the override sensor.

12. The brake testing device according to claim 11 wherein the towing vehicle further comprises a trailer brake release arranged to supply pressure to the air brakes of the trailer to release the brakes when activated and a vehicle brake release arranged to supply pressure to brakes of the towing vehicle to release the brakes when activated, and wherein the override sensor of the brake testing device is arranged to detect when both the trailer brake release and the vehicle brake release are activated.

13. The brake testing device according to claim 12 wherein the override sensor comprises a pair of air switches in communication with the trailer brake release and the vehicle brake release respectively.

14. A brake testing device in combination with a towing vehicle for connection to a trailer having a left turn indicator, a right turn indicator and brake lights, wherein the vehicle comprises:
a left turn indicator circuit for actuating a left turn indicator of the vehicle;
a right turn indicator circuit for actuating a right turn indicator of the vehicle;
a braking indicator circuit for actuating a brake light of the vehicle;
a trailer connector including a left turn indicator output in connection with the left turn indicator circuit for actuating the left turn indicator of the trailer, a right turn indicator output in connection with the right turn indicator circuit for actuating the right turn indicator of the trailer, and a braking output in connection with the braking indicator circuit for actuating the brake lights of the trailer;
and wherein the brake testing device comprises:
a remote controller arranged to generate a left turn signal, a right turn signal and a brake signal;
a control module including:
a receiver arranged to receive the left turn signal, the right turn signal and the brake signal from the remote controller;
a left turn output connected to the left turn indicator circuit so as to be arranged to activate the left turn indicator of the trailer in response to receipt of the left turn signal by the receiver;
a right turn output connected to the right turn indicator circuit so as to be arranged to activate the right turn indicator of the trailer in response to receipt of the right turn signal by the receiver; and
a brake output connected to the braking indicator circuit so as to be arranged to activate the brake lights of the trailer in response to receipt of the brake signal by the receiver.

15. The brake testing device according to claim 14 wherein the control module includes a power input arranged to connect to a battery of the vehicle.

16. The brake testing device according to claim 14 wherein the left turn output and the right turn output each comprise a splice connector in spliced connection with the respective indicator circuit.

17. The brake testing device according to claim 14 wherein the left turn output and right turn output comprise plug-in connectors in modular connection with a wiring harness of the indicator circuits.

* * * * *